United States Patent [19]
Watson et al.

[11] Patent Number: 5,117,132
[45] Date of Patent: May 26, 1992

[54] FLEXIBLE UTILIZATION OF GENERAL FLIP-FLOPS IN PROGRAMMABLE ARRAY LOGIC

[75] Inventors: Leland E. Watson, Mission Viejo; Saul Barajas, Capistrano Beach; Bruce E. Whittaker, Mission Viejo, all of Calif.

[73] Assignee: Unisys Corporation, Blue Bell, Pa.

[21] Appl. No.: 652,847

[22] Filed: Feb. 8, 1991

[51] Int. Cl.⁵ .......................................... H03K 19/177
[52] U.S. Cl. ................................... 307/465; 307/480; 307/272.2
[58] Field of Search ............... 307/465, 468, 469, 480, 307/272.2

[56] References Cited

U.S. PATENT DOCUMENTS

| | | | |
|---|---|---|---|
| 4,789,951 | 12/1988 | Birkner et al. | 307/465 X |
| 4,879,481 | 11/1989 | Pathak et al. | 307/468 X |
| 4,912,345 | 3/1990 | Steele et al. | 307/465 |

*Primary Examiner*—David Hudspeth
*Attorney, Agent, or Firm*—Alfred W. Kozak; Mark T. Starr

[57] ABSTRACT

A programmable array logic unit (PAL) having a disconnected array of gates, inverters and D-Type flip-flops, is utilized by burning-in the interconnections, to enable the D flip-flops to function as J-K flip-flops and/or toggle flip-flops to enable flexibility in the functions available for utilization, by providing inputs for Direct Set, Direct Clear and Hold.

13 Claims, 5 Drawing Sheets

TABLE I

| J | K | Q | Q+ |
|---|---|---|----|
| 0 | 0 | 0 | 0 |
| 0 | 1 | 0 | 0 |
| 1 | 0 | 0 | 1 |
| 1 | 1 | 0 | 1 |
| 0 | 0 | 1 | 1 |
| 0 | 1 | 1 | 0 |
| 1 | 0 | 1 | 1 |
| 1 | 1 | 1 | 0 |

Q  PRESENT STATE
Q+ NEXT STATE

FIG. 6A

TABLE III

| T | Q | Q+ |
|---|---|----|
| 0 | 0 | 0 |
| 0 | 1 | 1 |
| 1 | 0 | 1 |
| 1 | 1 | 0 |

T  TOGGLE
Q  PRESENT STATE
Q+ NEXT STATE

FIG. 6C

\* = NORMAL OPERATION AS PER TABLE I

\*\* = FLIP FLOP BEHAVES AS THE T OUTPUT OF TABLE III

TABLE II

| DIRECT SET | HOLD | Q+ |
|---|---|---|
| 0 | 0 | SEE TABLE I* |
| 1 | 0 | 1 |
| 0,1 | 1 | Q+ HOLD Q |

FIG. 6B

TABLE IV

| DIRECT SET | HOLD | Q+ |
|---|---|---|
| 0 | 0 | SEE TABLE III** |
| 1 | 0 | 1 |
| 0,1 | 1 | Q+ HOLD Q |

FIG. 6D

FLEXIBLE UTILIZATION OF GENERAL FLIP-FLOPS IN PROGRAMMABLE ARRAY LOGIC

FIELD OF THE INVENTION

This disclosure involves systems and methods for taking generalized flip-flops in programmable array logic in order to provide flexible types of functions which might be desired.

BACKGROUND OF THE INVENTION

Modern day circuitry usage has used certain types of logic design called programmable array logic units or PALS. PALS provide flexibility and logic design by providing uncommitted and unconnected AND gates, OR gates, in addition to simple D-Type flip-flops.

After the designer decides what functions he would desire, he then implements these functions by interconnecting or disconnecting the various gates and flip-flops in order to implement his desired circuitry. However, the usually provided circuitry in the PALS are not generally flexible enough or sufficient for all the functions required and thus it is desirable to implement many different types of flip-flops in a PAL by merely using only the basic D-Type flip-flops.

The programmable array logic units used are typically those provided by such manufacturers as Advanced Micro Devices of Sunnyvale, CA whose address is 901 Thompson Place, Sunnyvale, CA 94088 and who provides the PAL types 22V10 and 16R4. However the system and techniques to utilize the variable types of flip-flops can be used with programmable array logic manufactured by other vendors or provided in other configurations.

The invention provides simple types of PALS with D-Type flip-flops and the following features:

(1) The flip-flop can be cleared to a desired state.
(2) The newly developed circuitry provides a mechanism to initiate a "hold" state.
(3) Each of the flip-flops can (programmatically) be made into an active "low" or to active "high" operational state.

It is especially desirable to provide the general flip-flops into operational functions such as a J-K flip-flop and as a toggle flip-flop. The present system and method indicates how this system and method can be effectuated.

The standard logic provided in a PAL is very limited, with no features. By interconnecting the AND gates, OR gates, inverters, buffers and D flip-flops, a very powerful general, useful flip-flop is constructed, with J, K, inputs, direct set, direct clear, and hold inputs. These features are essential and used in certain advanced computer systems.

The PALs as provided by the manufacturers, have only simple D flip-flops and unconnected AND gates, buffers, OR gates and inverters. In these PALs, a D flip-flop output follows its D input at the rising edge of the clock That is if the input is "0", after the rising edge, the output will be "0". If the D input is a "1", then the output will change to a "1" after the next rising edge of the clock. Therefore, the D flip-flop does not have the means to "hold" a value for more than one clock, after the setting value at the D input, is removed. This inability to hold a value can be a problem since it is sometimes desired that the D flip-flop hold its value for a longer period of time.

The problem is solved by configuring the D flip-flops in the PALS to have inputs of direct set, direct clear, J,K, and hold. The newly added features make it possible, so that to set the flip-flop, all is needed is to raise the J input to a ONE (1). Once the flip-flop sets, after the rising edge of the clock, there is no need to maintain the J input at a ONE (1). Yet the flip-flop will hold that value for as many clocks as necessary. When required to clear it, only the K input is raised to a ONE (1) for one clock duration, and the flip-flop will be cleared.

SUMMARY OF THE INVENTION

The programmable array logic module has a basic structure which includes a number of D flip-flops together with structures of AND and OR gates which can be interconnected by burning a pattern into the logic module in order to provide the desired logic functions.

The present arrangement for the programmable array logic module is to have, within its circuitry, the design drawn up and added with OR, NOR, inverter, plus AND gates, and then using the D flip-flops to implement more flexible structures by enabling them to be configured to act as J-K flip-flops and as toggle flip-flops. The described implementation will use interconnected AND gates, OR gates and D flip-flops which are the basic building block elements of the PAL units.

Thus, the PAL structured module can meet the following requirements, that is to say (i) it can be made to act as a J-K flip-flop; (ii) it can act as a toggle flip-flop; (iii) all the flip-flops can be functional in either an active low or a high state; (iv) all the flip-flops can be cleared to a known state; (v) all the flip-flops can also be held at the current state of existence for maintenance diagnostics.

An important feature of this configuration is the ability to directly set the flip-flop regardless of the values of the J and K inputs. This feature can be used during maintenance and debug to initiate a sequence and make it look to the rest of the logic as if the control portion of the logic initiated it.

Another feature is the ability to directly clear the flip-flop. During power-up of the circuitry, that is, when it is turned on, all the flip-flops will go to a known, cleared, state. Otherwise the flip-flops would come on in a completely random pattern. Also it is necessary to clear or initialize the circuitry during maintenance and debug. This feature is used very often to place the circuitry in a known state, after running test routines. After each routine or test, the circuitry is cleared.

In computer systems which have extensive use of shift chains for maintenance, the system state must be held after the shift has been completed. During the shift, the control inputs to the flip-flop are changing, yet by controlling the hold line, even though the rest of the control lines are changing, the flip-flop will maintain its state.

The combination of shifting of the flip-flops, in shiftable flip-flops chains, and the direct clear and hold are used extensively, during debug, routine maintenance, and each time the system circuitry is turned on.

BRIEF DESCRIPTION OF THE DRAWINGS

FIGS. 6A, 6B, 6C, and 6D are drawings showing a group of tables involved with the functional configurations wherein table I (FIG. 6A) is a truth table indicating the functionality of the J-K flip-flop while table II (FIG. 6B) indicates the effects of the direct set and the hold functions on the J-K flip-flop. Table III (FIG. 6C) is a truth table showing the functionality of the toggle flip-flop while table IV (FIG. 6D) indicates the use of the direct set signal and the hold signal on the toggle flip-flop.

DESCRIPTION OF PREFERRED EMBODIMENT

Figure 1A:
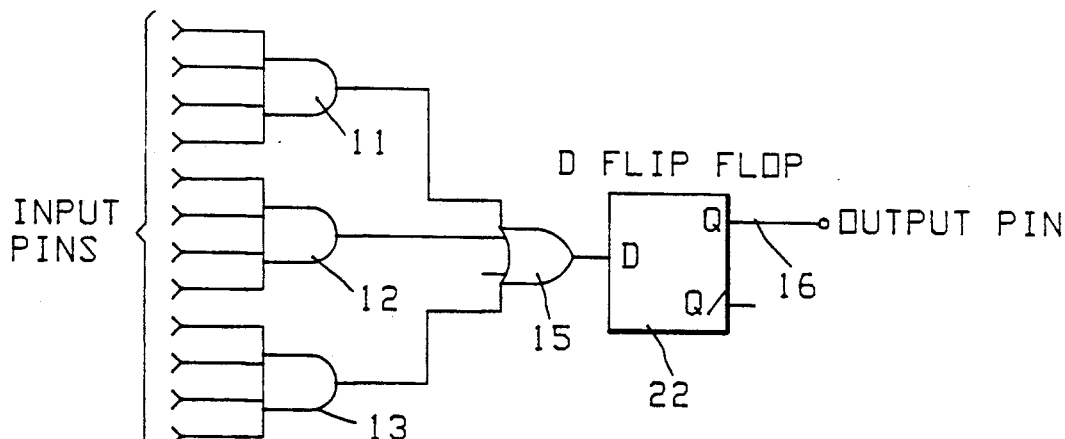
FIGS. 1A, 1B and 1C show schematic drawings showing how a series of D flip-flops are interconnected with sets of gates in various locational areas in order
Figure 1B:
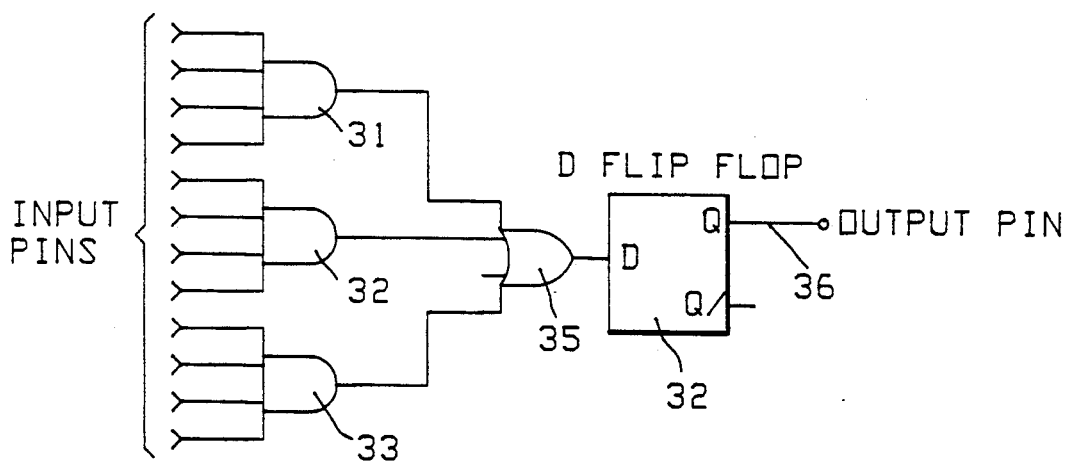
Figure 1C:
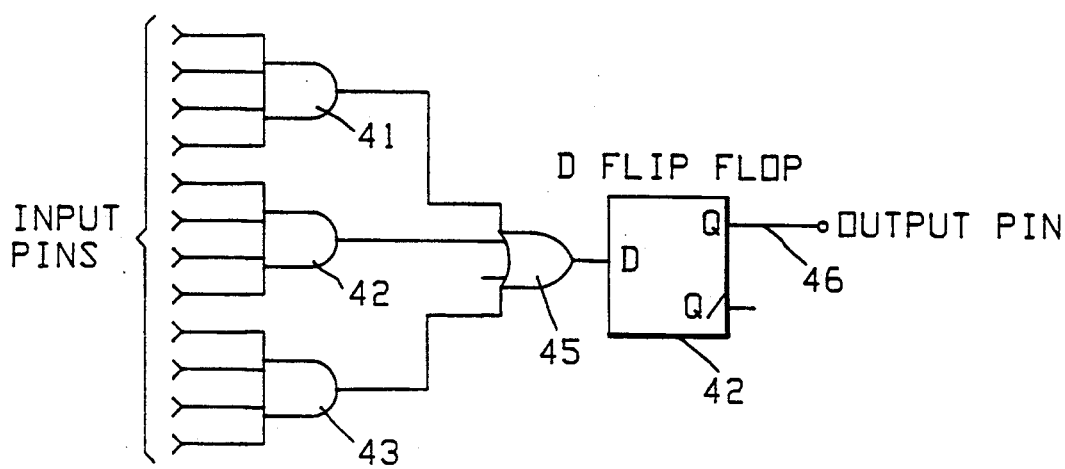

Referring to FIG. 1 there is shown a series of D flip-flops 22, 32, 42, etc. which are designed into an integrated circuit and each of the D flip-flops are connected with a pattern of gates shown as 11, 12, 13; 31, 32, 33; 41, 42, and 43. Each of these basic units has a series of input pins and each set has an output pin such as 16, 36, and 46.

In many cases it is desirable to have certain of these D flip-flops function as J-K flip-flops.

Figure 2:
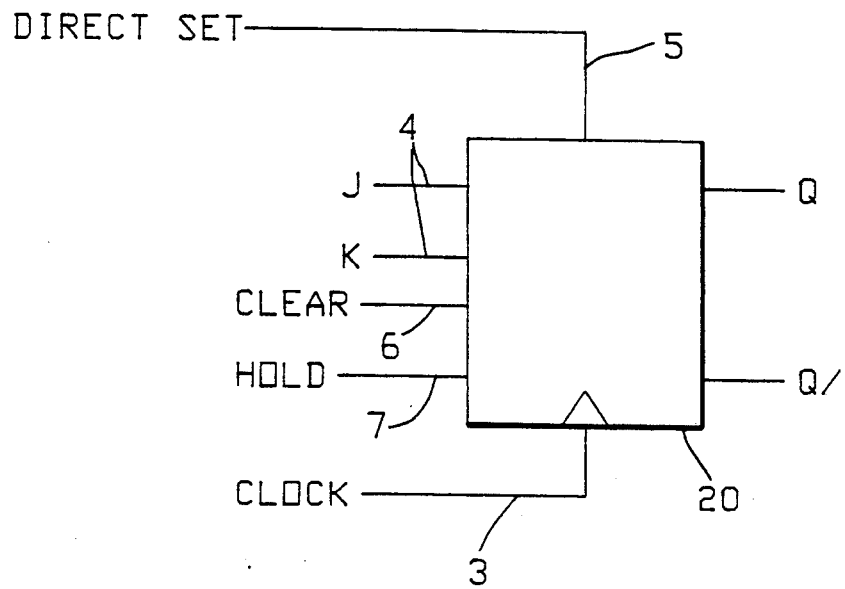
FIG. 2 is a schematic diagram of a J-K flip-flop.

FIG. 2 shows a schematic drawing of typical J-K flip-flop 20 having a direct set input line 5 plus a set of J-K inputs designated $4_j$ and $4_k$. The clocking signal is input on line 3 while the clear line 6 and the hold line 7 operate as inputs to the J-K flip-flop 20.

Table I of FIG. 6A presents a truth table where there is seen the types of inputs to the J input and the K input with the resultant outputs designated Q and Q plus, where Q represents the present state and "Q+" represents the next occurring state.

Figure 3:
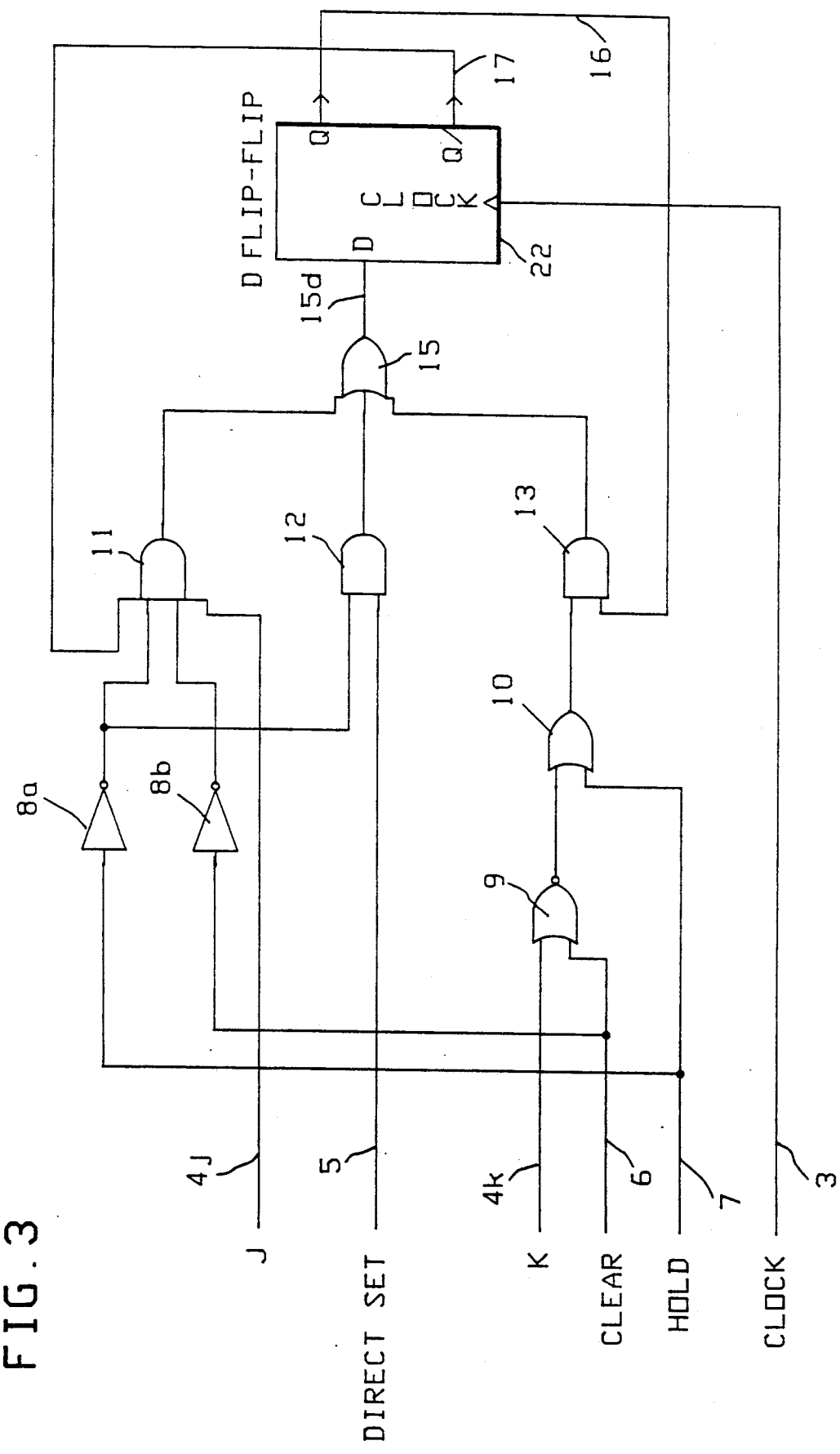
FIG. 3 is a circuit diagram showing how the D flip-flop can be operationally connected to gates in order to perform the J-K functions.

FIG. 3 indicates how the J-K flip-flop functionality of flip-flop 20 (FIG. 2) can be effectuated in the PAL using the D flip-flop 22. As seen in FIG. 3, a series of gates and inverters are used to implement the J-K function. For example, the D input to the D flip-flop 22 is inserted on line $15_d$ from the OR gate 15. The OR gate 15 is fed from the AND gates 11, 12, and 13.

The AND gate 11 receives inputs from inverter $8_a$ and from $8_b$ in addition to receiving the J input on line $4_j$. Additionally AND gate 11 receives another input on line 17 from the Q/ output of the D flip-flop 22.

The AND gate 12 receives one input from the inverter $8_a$ and another input from the direct set line 5.

The AND gate 13 receives one input from the OR gate 10 which has 2 inputs, one of which is from the NOR gate 9 and the other input is from the hold line 7. The NOR gate 9 has one input from the K input on line $4_k$ and its other line input is from the clear line 6.

The AND gate 13 receives one input from the Q output on line 16 of the D flip-flop 22. Additionally the clock line 3 is used to clock the D flip-flop of FIG. 3.

Referring to the truth tables of and Table I (FIG. 6A) with reference to the J-K flip-flop using the D flip-flop of FIG. 3, it will be seen that when the J and the K inputs are "0", then the output of the flip-flop 22 will be maintained. For example, when the J and K inputs are both zero and the Q output is zero, then the next state of "Q+" will still remain zero. Likewise when the J and the K inputs are both zero and the Q output is a one then the next state of Q plus will remain as a "1".

Another way of observing this is when the J and the K inputs are zero, the output of the flip-flop 22 at the output Q on line 16 will remain the same. If the flip-flop has an output of Q equal to zero, and the J and K are at zero, then the logic will create a zero at the input of the D flip-flop and thus "hold" the D flip-flop 22 at zero on line 16 (Q output).

In order to "set" the flip-flop 22, the logic gate 11 in FIG. 3 will be activated to give a "1" by setting the J input $4_j$ to a "1" (Table I, FIG. 6A).

To "reset" the flip-flop 22, (FIG. 3) the K input on line $4_k$ is set to a "1" which then activates the logic gate 13, which together with gates 11 and 12, in FIG. 3 will cause a "0" output on line 16 (Q). (The OR gate 15 passes a "zero" to the D input of the flip-flop 22 thus resetting it so that Q/, on line 17, becomes a "1").

It is further possible to "toggle" flip-flop 22 of FIG. 3 by setting both inputs $4_j$ and $4_k$ to a value of "1". If the flip-flop 22 is "set", then the Q output (line 16) will be a "1" and gates 11, 12, and 13 will have an output of zero which will toggle the flip-flop output Q (line 16) to a value of "0" (which is the next state Q+), as noted in Table III, FIG. 6C.

On the other hand if the flip-flop 22 of FIG. 3 is now "reset", then the output line 17 at Q/ will be a "1", and gate 11 will have an output of "1" and the gates 12 and 13 will have an output of "0". Thus the OR gate 15 will generate a "1" and the flip-flop 22 will toggle to the Q set state which has a value of "1".

Additionally the flip-flop shown in FIG. 3 has 2 additional characteristics which involve an input clear line on line 6, which is a "clear" function and also has a "hold" function via line 7. The clear function is used to initialize the system to a known state during the power up sequence or when in a maintenance mode.

Some flip-flops need to be cleared to the active low state. This capability is also provided, such that when the flip-flop 20 is set, it will set to the value of "0" so that Q on line 16 will have a value of "0". The flip-flop 20 of FIG. 2 will be cleared to reset Q/ to a value of "1" regardless of the other inputs except for the hold function.

In FIG. 3 there is a considered use for the "clear" function. If the clear input line 6 is a "1", and the hold input line 7 is a "0" (meaning "not on hold") then the gate 13 will generate a "0". The input of the input line 5 (of direct set) is "0", causing the gate 12 to have a zero output. Gate 11 will also have a "0" output because the clear input on line 6 is a "1".

Since all of the three gates 11, 12, and 13 have "0" outputs, the D flip-flop 22 will then be cleared. In FIG. 3 the "hold" signal on line 7 overrides all of the control inputs as will be indicated in FIG. 3 and on table 2 (FIG. 6).

By placing the hold line 7 at "0", the "hold circuitry" is deactivated, allowing the flip-flop 22 to behave according to Table I, FIG. 6A.

When the hold line 7 is "1", the hold function is active and the flip-flop is "frozen" in its current state.

If the hold signal is "0", the flip-flop 22 is allowed to operate normally according to the states shown in Table I of FIG. 6A. On the other hand, if the hold is a value of "1", then the gates 11 and 12 will generate zeros. AND gate 13 now provides the hold function. If Q is "zero", the output of gate 13=0, and it provides a "zero" to the D input of flip-flop 22, therefore holding the value of "0". If the Q output of line 16 is="1" gate 13 passes a "1" onto the D input via line 15$_d$, thus holding the value of "1".

The "hold" function is used extensively in the diagnostic maintenance mode where the system is stopped and the system is required to remain in a known state. Further when the state is being read, the inputs to the PAL logic are changing; however, by using the hold mode, the state of the flip-flop 22 is maintained.

To set the flip-flop 22 regardless of any of the other inputs (except hold) the input signal "direct set" on line 5 is activated to a "1". Since the hold signal on line 7 is at "0", then the gate 12 will have an output of "1" thus setting the flip-flop 22.

It may be noted that all the transitions described herein will occur at the rising edge of the clock signal on line 3.

Figure 4:
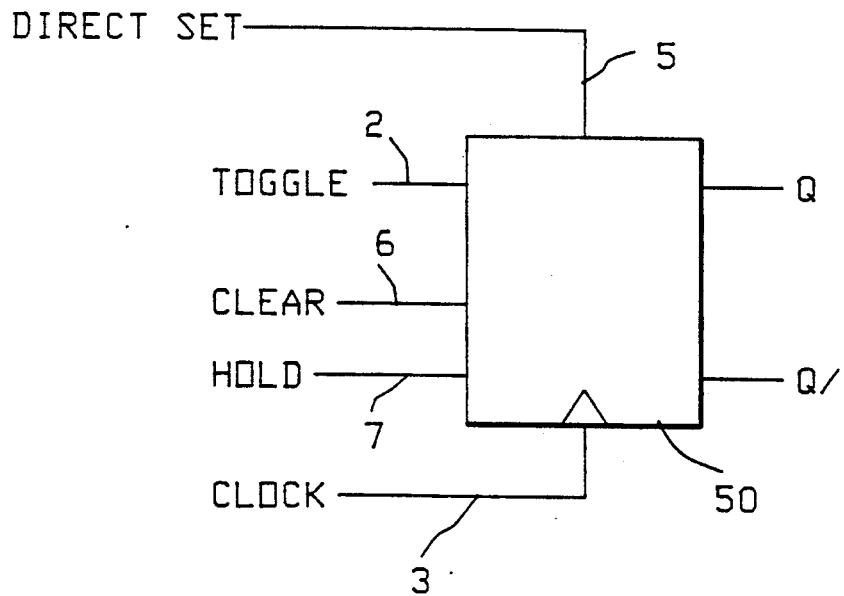
FIG. 4 is a schematic drawing showing a toggle flip-flop.

FIG. 4 shows a schematic drawing of a toggle flip-flop 50 having a clock signal on line 3, a direct set signal on line 5, a toggle input signal on line 2 with a clear signal on line 6 and a hold signal on line 7. The outputs are the standard Q output and its complement Q/.

Table III of FIG. 6C shows the truth table of the toggle flip-flop 50, FIG. 4, indicating the present state Q and the next state Q+depending on the signal on the toggle line 2, of FIG. 4.

Table IV (FIG. 6D) shows the influence of the direct set signal and the hold signal on the toggle flip-flop 50.

Figure 5:
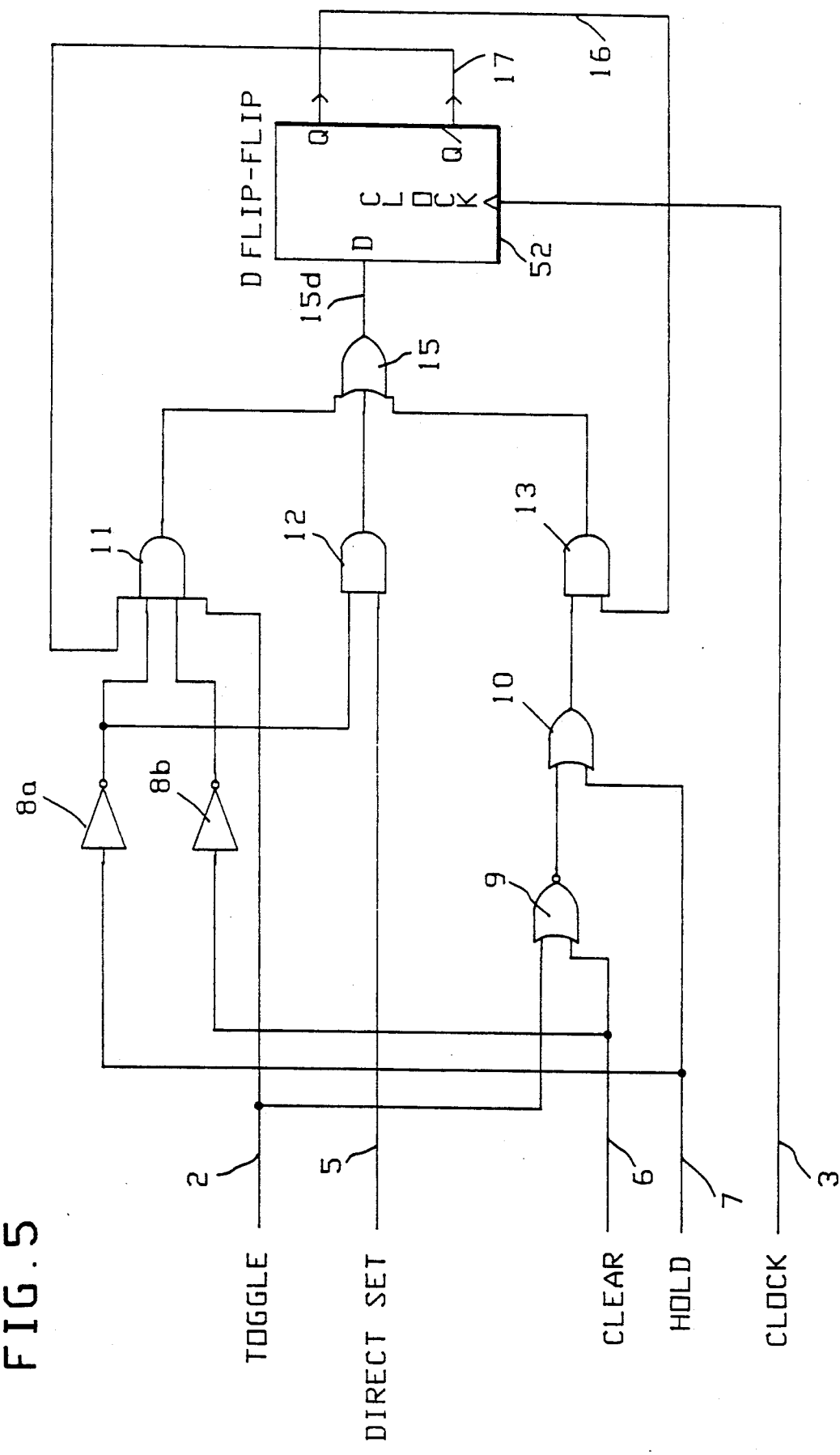
FIG. 5 is an extended circuit drawing showing how the basic D flip-flop can be configured with gates in order to function as a toggle flip-flop.

FIG. 5 shows how a D flip-flop can be connected up with a series of gates and inverters in order to perform the functions of a toggle flip-flop.

Referring to FIG. 5, the D flip-flop 52 has 2 outputs designated Q on line 16 and Q/ on line 17. The D input to the flip-flop 52 is shown on line 15$_d$ which is the output of the OR gate 15. As previously described, the OR gate 15 has three inputs from the gates 11, 12, and 13 while the three gates 11, 12, and 13 are seen to have inputs from various ones of the input signals and other gates, and inverters.

AND gate 11 (FIG. 5) is fed inputs from the Q/ (line 17) and toggle signal line 2 in addition to inputs from clear line 6 and hold line 7 via inverters 8$a$, 8$b$.

AND gate 12 receives a control signal (Direct Set) line 5 as input in addition to the output of inverter 8$a$ (carrying the hold signal line 7.

AND gate 13 has one input from Q output line 16 and another input from OR gate 10.

OR gate 10 receives one input from NOR gate 9 and one input from Hold line 7.

NOR gate 9 has one control input line 2 (Toggle) and one control input line 6 (Clear).

Thus the toggle flip-flop shown in FIG. 5 has all the "clear" and "hold" functions plus the normal toggle capability.

When the Q output on line 16 of the flip-flop 52 (FIG. 5) is at a value of "0" and the toggle line 2 is also "0", then the gates 11, 12, and 13 also have an output of "0" causing the flip-flop 52 to hold and to remain at 0 at the Q output on line 16.

When the flip-flop 52 is "set" via Direct Set line 5, then the Q output on line 16 becomes a "1" and the toggle line 2 is "0", so that gate 13 will pass a "1" to the D input of the flip-flop 52 making the flip-flop "hold" and stay at a value of "1".

In FIG. 5, when the toggle line 2 has a value of "1", and the Q output line 16 is "0", the gate 11 passes a "1" signal and gates 12 and 13 pass a "0" signal. The OR gate 15 gives and output of "1" toggling the flip-flop 52.

Now, when the toggle line 2 is a "1" and the Q output on line 16 is a "1" (Q/=0), then gates 11, 12, and 13 generate all zeros and the OR gate 15 generates a 0 to the D input of the flip-flop 52, thus resetting the flip-flop 52 so that Q/ has a value of "1". Thus the flip-flop 52 has toggled.

It may be noted that the toggle flip-flop 52 also has the "Clear" and the "Hold" capabilities which were previously described for the J-K flip-flop of FIG. 3.

Disclosed herein has been a system and method where any D type flip-flop in the programmable array logic module can be made into a J-K flip-flop and a toggle flip-flop. Additionally, the system shows the ability to make active "low" flip-flops in addition to a clearing function, a direct set and a hold function. These characteristics are unusually unique because of the use of the D flip-flop in the programmable array logic module.

It may be noted that this system is applicable to other implementations in ASICs or Applications Specific Integrated Circuits or also in VLSI or Very Large Scale Integration Circuitry in addition to other programmable array logic types such as PLAs (Programmable Logic Array Units). Thus flexibility can be provided in any of these type modules with the same type of flexibility provided for the described programmable array logic.

While certain specific embodiments of the above described flexible utilization of programmable array logic have been described herein, it should be noted that other implementations of the invented concept may be implemented with other configurations and the invention should thus be understood in terms of the following claims.

What is claimed is:

1. In a programmable array logic module (PAL) having a plurality of D-Type flip-flops and a plurality of gating means, a system for providing flexible functionality comprising:
   (a) a plurality of D-Type flip-flops;
   (b) a plurality of gating means;
   (c) means to connect said gating means to one or more of said D-Type flip-flops to provide the functionality of a J-K flip-flop;
   (d) means for holding each of said flip-flops at its current state condition, regardless of control signals which normally influence said flip-flops.

2. The system of claim 1 which includes:
   (a) means for providing one or more of said D flip-flops with a functionality of a toggle flip-flop.

3. The system of claim 1 which includes means to set the flip-flops as active in either the low or high logic state.

4. The system of claim 1 which includes:
   (a) means for clearing each said flip-flop to a known state.

5. A programmable array logic (PAL) chip having unconnected gates, inverters, and D-flip flops comprising:
   (a) means to interconnect said gates, inverters, and flip-flops to provide flexibility in types of circuit functions desired;
   (b) said D-flip-flops being interconnected with said gates and inverters in order to function as J-K flip-flops;

(c) means to hold the state of a J-K flip-flop regardless of any input to said J-K flip-flop.

6. The PAL chip of claim 5 wherein said flip-flops are configured to function as toggle flip-flops.

7. The PAL chip of claim 5 which includes:
(a) means to clear any state residing in anyone of said J-K flip-flops.

8. The PAL chip of claim 6 which includes:
(a) means to clear any one of said toggle flip-flops.

9. The PAL chip of claim 5 which includes:
(a) means to directly set the output state of any one of said J-K flip-flops.

10. The PAL chip of claim 6 which includes:
(a) means to directly set the output state of any one of said toggle flip-flops.

11. The PAL chip of claim 5 which includes:
(a) clock input means to regulate the point in time that each said J-K flip-flop may be enabled to change its output state.

12. The PAL chip of claim 6 which includes:
(a) clock input means to regulate the point in time that each said toggle flip-flop may be enabled to change its output state.

13. In a programmable array logic (PAL) chip having unconnected gates, inverters, and D-flip-flops, a method for providing internal circuit flexibility comprising the steps of:
(a) burning in connections of gating means to configure one or more of said D-flip-flops into J-K functional flip-flops;
(b) burning in connections of gating means to configure one or more of said D-flip-flops int functional toggle flip-flops;
(c) connecting a "hold" input line to said functional J-K and toggle flip-flops to enable freezing of the state condition of each said flip-flops regardless of other control signals connected to said flip-flops.

* * * * *